(12) United States Patent
Nakatsu et al.

(10) Patent No.: US 7,969,735 B2
(45) Date of Patent: Jun. 28, 2011

(54) POWER CONVERTER

(75) Inventors: Kinya Nakatsu, Hitachinaka (JP);
Takayoshi Nakamura, Hitachi (JP);
Ryuichi Saito, Hitachi (JP); Takashi Suga, Yokohama (JP); Hiroki Funato, Nagoya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/161,151

(22) PCT Filed: Jan. 17, 2007

(86) PCT No.: PCT/JP2007/050563
§ 371 (c)(1),
(2), (4) Date: Mar. 30, 2010

(87) PCT Pub. No.: WO2007/083648
PCT Pub. Date: Jul. 26, 2007

(65) Prior Publication Data
US 2010/0188813 A1 Jul. 29, 2010

(30) Foreign Application Priority Data

Jan. 17, 2006 (JP) .................................. 2006-009154

(51) Int. Cl.
*H05K 7/20* (2006.01)
(52) U.S. Cl. ........ 361/699; 361/688; 361/689; 361/707; 361/715; 165/104.33
(58) Field of Classification Search .......................... None
See application file for complete search history.

(56) References Cited

U.S. PATENT DOCUMENTS

| 5,631,821 | A | 5/1997 | Muso |
| 5,966,291 | A | 10/1999 | Baumel et al. |
| 6,166,937 | A | 12/2000 | Yamamura et al. |
| 6,230,509 | B1 | 5/2001 | Yamamoto |
| 6,414,867 | B2 | 7/2002 | Suzuki et al. |
| 6,621,701 | B2 | 9/2003 | Tamba et al. |

FOREIGN PATENT DOCUMENTS

| JP | 61-86982 U | 6/1986 |
| JP | 7-297561 A | 11/1995 |
| JP | 9-237992 A | 9/1997 |

(Continued)

OTHER PUBLICATIONS

U.S. Office Action dated Jul. 16, 2010 (Six (6) pages).

(Continued)

*Primary Examiner* — Boris L Chervinsky
(74) *Attorney, Agent, or Firm* — Crowell & Moring LLP

(57) ABSTRACT

The object is to provide a power converter which is capable of minimizing an extent to which the power converter components other than the semiconductor module are thermally affected by the heat originating from the semiconductor module.

Figure 1:
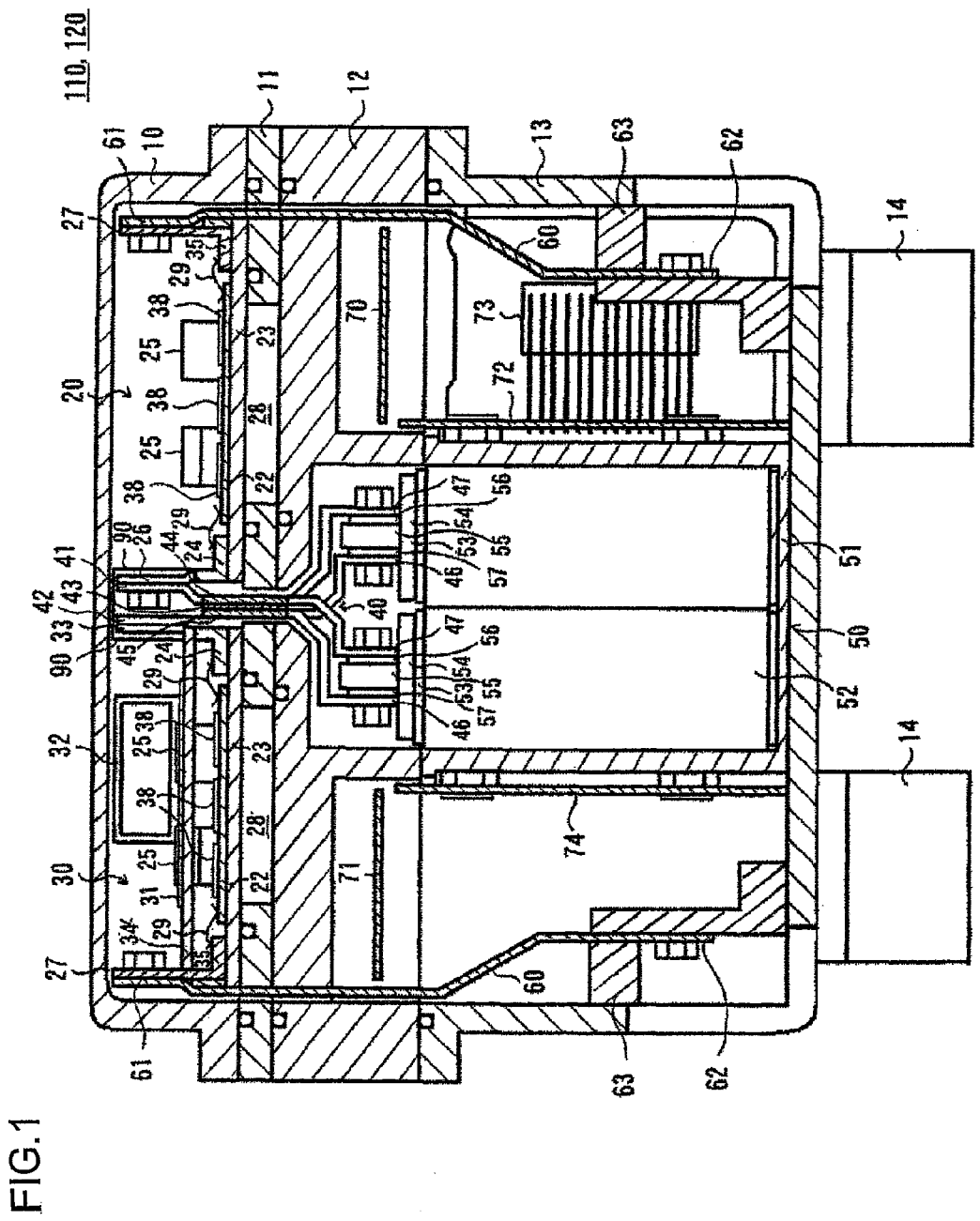

A casing houses: semiconductor modules 20, 30 constituting a main circuit for power conversion; a capacitor 50 electrically connected to the main circuit; drive circuits 70, 71 that provide the main circuit with a drive signal used in power conversion operation; a control circuit 74 that provides the drive circuit with a control signal used to prompt the drive circuit to provide the drive signal. Within the casing, a cooling chamber including a coolant passage 28 is formed, and a chamber wall of the cooling chamber is formed with a thermally conductive material. At least the semiconductor modules 20, 30 are housed inside the cooling chamber, and at least the capacitor 50 and the control circuit 74 are disposed outside the cooling chamber.

15 Claims, 12 Drawing Sheets

FOREIGN PATENT DOCUMENTS

| | | |
|---|---|---|
| JP | 10-248266 A | 9/1998 |
| JP | 2000-14169 A | 1/2000 |
| JP | 2003-199363 A | 7/2003 |
| JP | 2004-266973 | 9/2004 |
| JP | 2004-312866 | 11/2004 |
| WO | WO 00/17994 A1 | 3/2000 |

OTHER PUBLICATIONS

International Search Report dated Mar. 27, 2007 (Four (4) Pages).
Chinese Office Action dated Apr. 29, 2010 with English translation (eight (8) pages).
Office Action received in Japanese Patent Application No. 2006-009154 dated Feb. 1, 2011.

POWER CONVERTER

TECHNICAL FIELD

The present invention relates to a power converter that converts input power to a specific type of power and outputs the power resulting from the conversion.

BACKGROUND ART

The background technologies related to power converters include the inverter device disclosed in patent reference literature 1. Patent reference literature 1 discloses a technology for miniaturizing an inverter device by stacking a switching element power module, a smoothing condenser and a control unit in this order via bases inside a case.

More specifically, patent reference literature 1 discloses a technology for controlling the braking force.

Patent reference literature 1: Japanese Laid Open Patent Publication No. 2003-199363

DISCLOSURE OF THE INVENTION

Problems to be Solved by the Invention

Today, more than ever, the power converter installed in an automobile to control the drive of a vehicle drive motor needs to be provided at lower cost, since a cost reduction achieved with regard to the power converter will allow a less expensive motor drive system to be installed in the vehicle, which, in turn, will make possible to further popularize the use of electric motors in vehicle drive. Through further promotion of electric motors in vehicle drive, the carbon footprint we leave on the global environment will be reduced and better fuel efficiency will be achieved.

A power converter may be provided at lower cost by, for instance, installing the power converter near the motor, e.g., at the casing of the transmission at which the motor is mounted, so as to eliminate the need to install wiring for electrically connecting the power converter and the motor. This structure may be achieved by, for instance, miniaturizing the power converter through miniaturization of the semiconductor module semiconductor chip constituting the power conversion main circuit so as to allow the power converter to be installed at the transmission casing within the limited installation space in the vehicle.

However, such miniaturization of the semiconductor chip is bound to result in an increase in the heat generated at the semiconductor chip. As a result, the internal temperature at the power converter will rise due to the increase in the quantity of heat released from a semiconductor module into the power converter. This gives rise to a concern that power converter components other than the semiconductor module in the power converter constituted with the power converter components including the semiconductor module disposed inside a single case are bound to be thermally affected. This issue is not addressed in the background art described earlier. Accordingly, when miniaturizing the power converter through miniaturization of the semiconductor chip, the extent to which the power converter components other than the semiconductor module are thermally affected by the heat from the semiconductor module needs to be mitigated.

Heat may also be generated at the semiconductor chip due to a loss occurring as the semiconductor is switched. This factor should also be taken into consideration and the heat generation at the semiconductor chip should be minimized by reducing the extent of loss occurring during the switching operation at the semiconductor, so as to achieve the miniaturization of the semiconductor chip in a comprehensive manner. It is crucial that the inductance at the connection conductor present between a capacitor electrically connected to the semiconductor module in order to further reduce the extent of loss occurring during the semiconductor switching operation. In short, in a power converter provided as a compact unit through miniaturization of the semiconductor chip, the extent to which the power converter components other than the semiconductor module are thermally affected by the heat originating from the semiconductor module must be minimized by reducing the loss occurring at the time of semiconductor switching operations and thus minimizing the heat generated at the semiconductor chip.

Means for Solving the Problems

The present invention provides a power converter in which the extent to which a component other than the semiconductor module is thermally affected by heat originating from the semiconductor module can be mitigated.

The power converter according to the present invention includes a semiconductor module constituting a power conversion main circuit, a capacitor electrically connected to the main circuit, a drive circuit that provides the main circuit with a drive signal used in power conversion operation and a control circuit that provides the drive circuit with a control signal used to prompt the drive circuit to provide the drive signal, all housed inside a casing. Inside the casing, a cooling chamber, having formed therein a coolant passage and a peripheral wall thereof defining the chamber and constituted of a thermally conductive material is formed. At least the semiconductor module is housed inside the cooling chamber, whereas at least the capacitor and the control circuit are disposed outside the cooling chamber.

Advantageous Effect of the Invention

According to the present invention, the semiconductor module is housed inside the cooling chamber with the peripheral wall thereof constituted of a thermally conductive material. Thus, even if the heat released from the semiconductor module increases, the heat is not readily released to the outside of the cooling chamber, which reduces at least the extent to which the capacitor and the control circuit are thermally affected by the heat from the semiconductor module. Consequently, the extent to which the heat from the semiconductor module thermally affects components other than the semiconductor module can be reduced by adopting the present invention.

Figure 2:
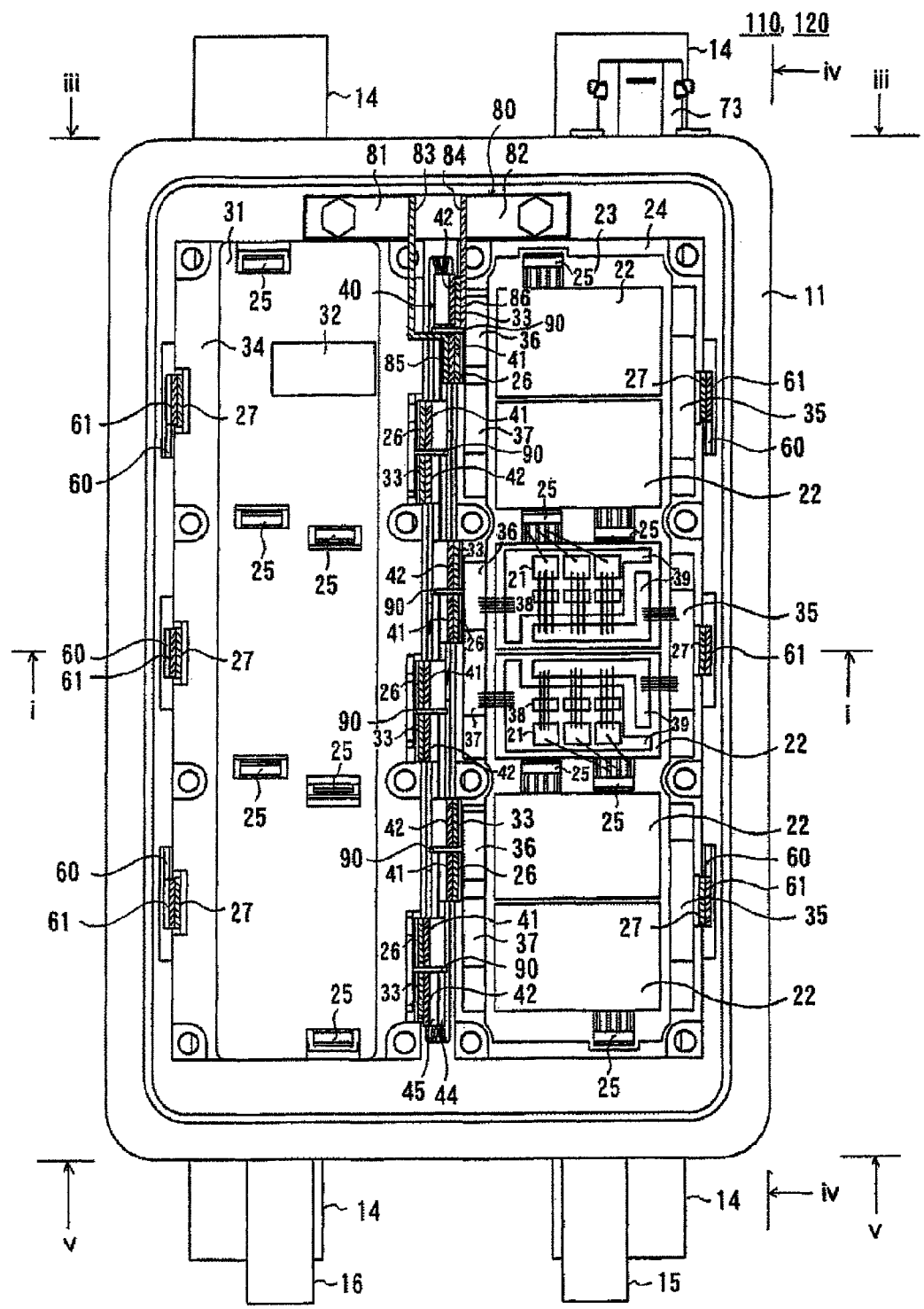
Figure 3:
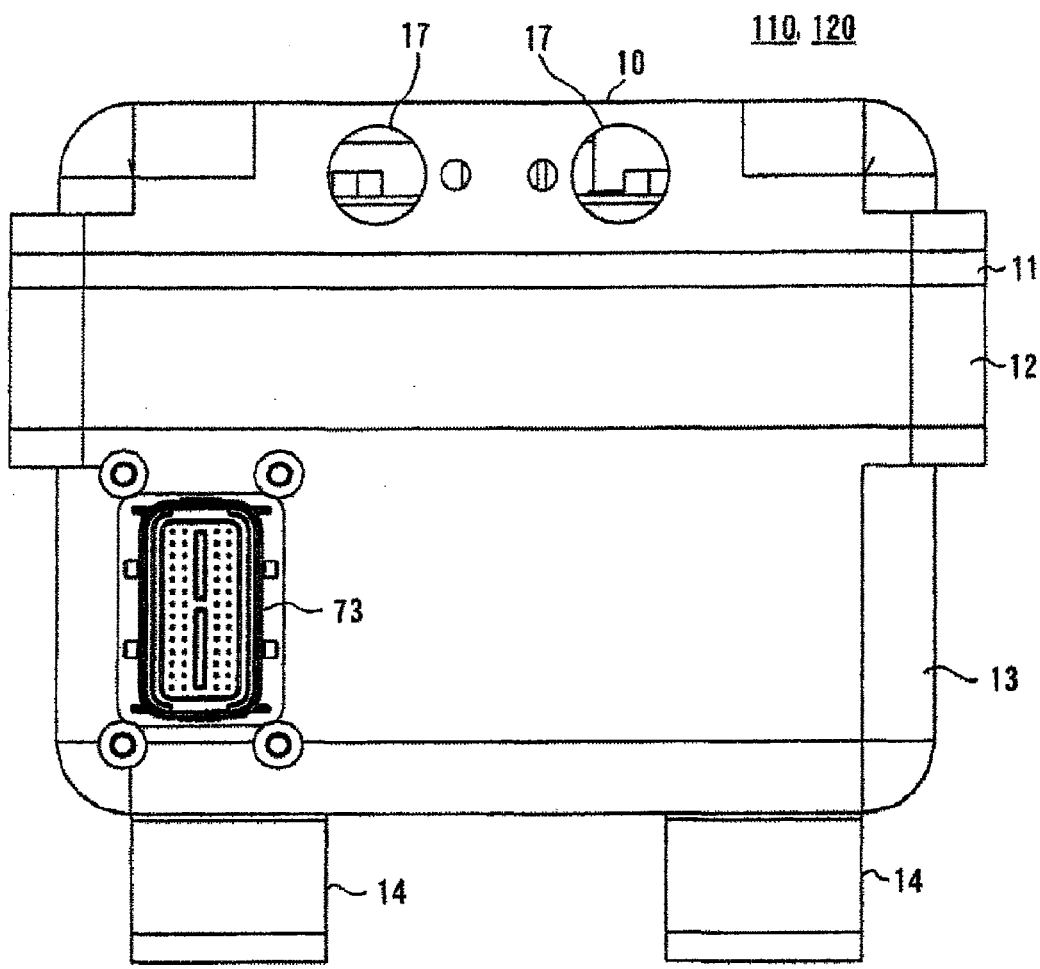
Figure 4:
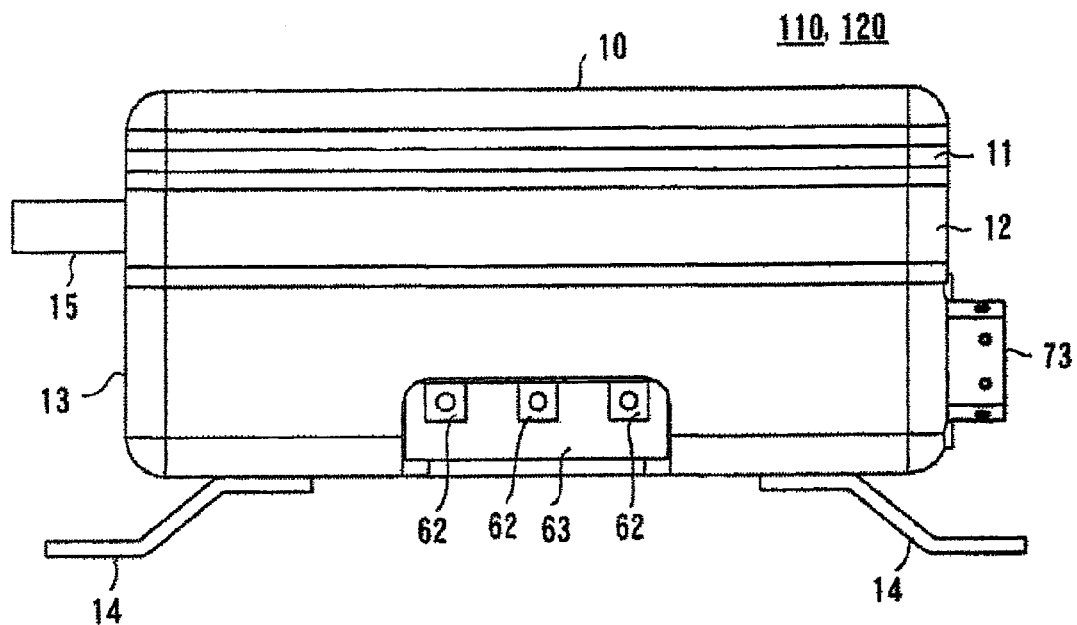
Figure 5:
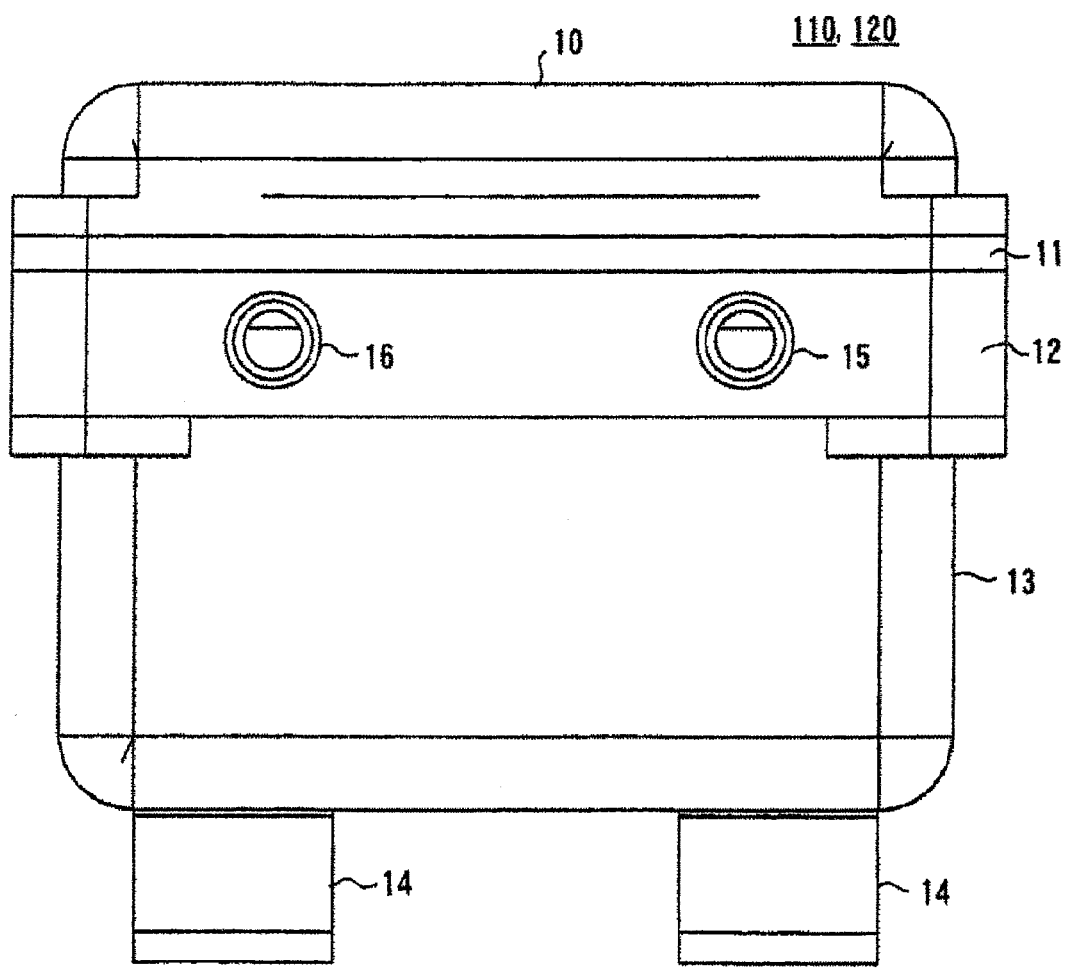
Figure 6:
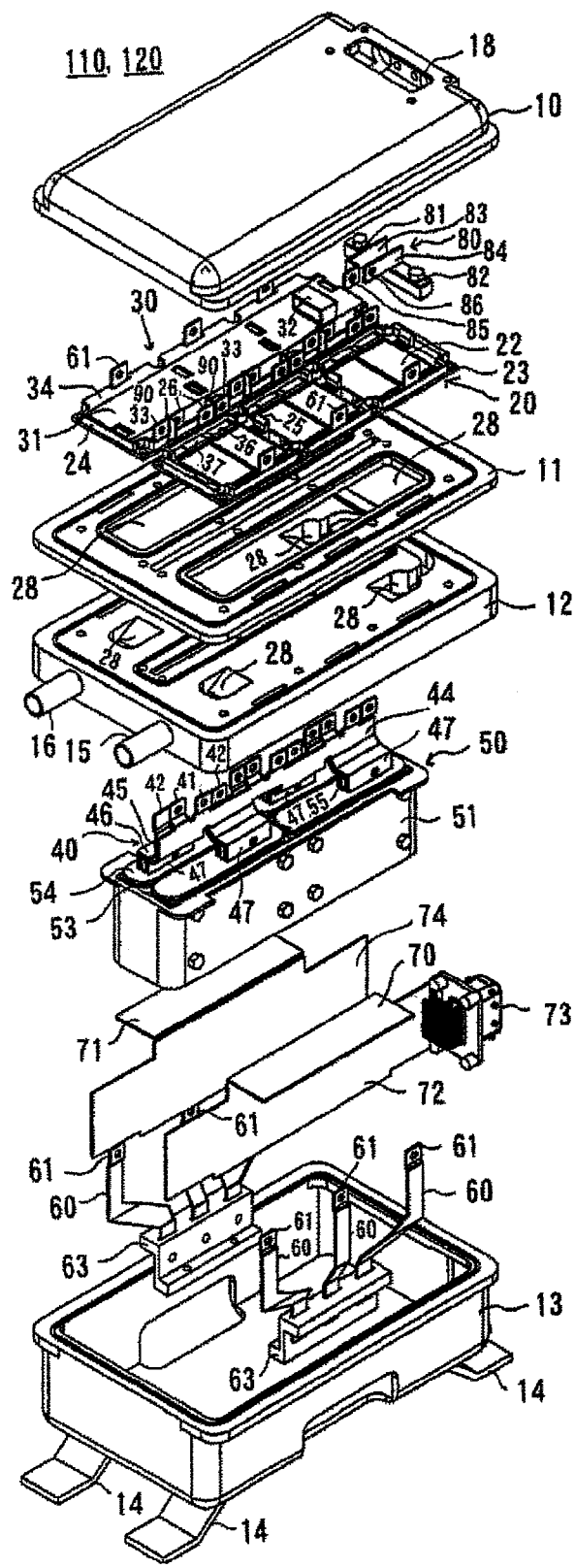

BRIEF DESCRIPTION OF THE DRAWINGS (FIG. 1) A sectional view showing the structure adopted in the inverter device unit achieved in a first embodiment (FIG. 2) A top plan view of the inverter device unit achieved in the first embodiment (FIG. 3) A side elevation showing the structure adopted in the inverter device unit achieved in the first embodiment (FIG. 4) A side elevation showing the structure adopted in the inverter device unit achieved in the first embodiment (FIG. 5) A side elevation showing the structure adopted in the inverter device unit achieved in the first embodiment (FIG. 6) An exploded perspective showing the structure adopted in the inverter device unit achieved in the first embodiment (FIG. 7) A circuit diagram showing the electrical circuit structure adopted in the inverter device unit achieved in the first embodiment (FIG. 8) A block diagram showing the drive system in a hybrid electric vehicle that may adopt the inverter device unit in the first embodiment (FIG. 9) A sectional view showing the structure adopted in the inverter device unit achieved in a second embodiment (FIG. 10) A sectional view showing the structure adopted in the inverter device unit achieved in a third embodiment (FIG. 11) A sectional view showing the structure adopted in the inverter device unit achieved in a fourth embodiment (FIG. 12) A block diagram showing the drive system in a hybrid electric vehicle that may adopt the inverter device unit in the fourth embodiment

EXPLANATION OF REFERENCE NUMERALS 20, 30 semiconductor module
50 capacitor
70, 71 drive circuit board
74 control circuit board
110, 120, 160 inverter device

BEST MODE FOR CARRYING OUT THE INVENTION

The following is an explanation of the embodiments of the present invention, given in reference to the drawings.

The explanation below is given in reference to the embodiments on an example in which a power converter according to the present invention constitutes an on-vehicle inverter device to be engaged in operation under extremely rigorous conditions with regard to, in particular, the heat cycle, the operating environment and the like. An on-vehicle inverter device to function as a control device that controls the drive of an on-vehicle motor is installed in an on-vehicle electric system. It converts DC power supplied from an on-vehicle battery constituting an on-vehicle power source to a predetermined AC power and controls the drive of the on-vehicle motor by supplying the AC power thus obtained to the on-vehicle motor.

It is to be noted that the structure described below may be adopted in a DC-DC power converter such as a DC chopper or an AC-DC power converter. Furthermore, the structure described below may be adopted in an industrial power converter to function as a motor control device used to control a motor that drives production equipment or a home power converter that may be used in a residential solar power system or a motor control device for driving home appliances. It is particularly desirable to adopt the present invention in a power converter to be provided as an inexpensive compact unit.

First Embodiment

The first embodiment of the present invention is now described in reference to FIGS. 1 through 8.

Figure 8:
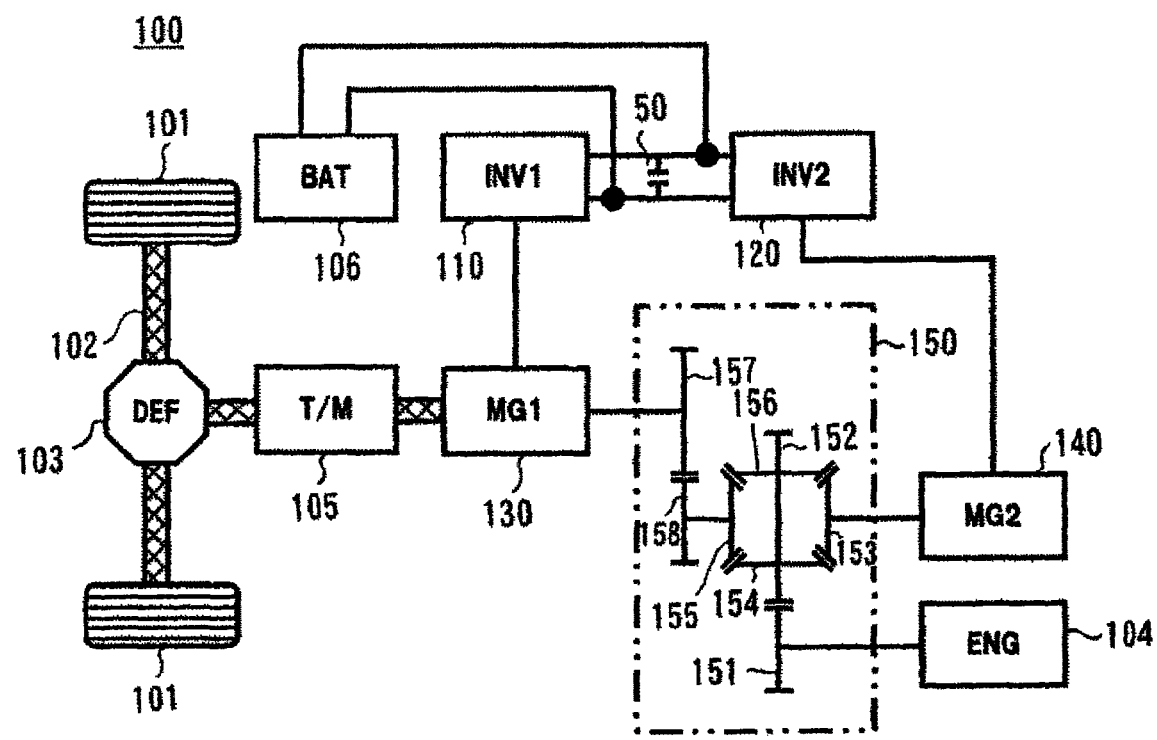

In reference to FIG. 8, a hybrid electric vehicle achieved in the embodiment is described.

The hybrid electric vehicle (hereinafter referred to as an "HEV") achieved in the embodiment, which is a type of electric vehicle, includes two drive systems. One of its drive systems is an engine system that uses an engine 104, i.e., an internal combustion engine, as its motive power source. The engine system is primarily utilized as an HEV drive source. The other drive system is an on-vehicle electric system that uses motor generators 130 and 140 as its motive power source. The on-vehicle electric system is mainly utilized as an HEV drive source and a power source that generates power to be used by the HEV.

At a front area of the vehicle body (not shown), a front axle 102 is axially supported so as to rotate freely. A pair of front wheels 101 are mounted at the two ends of the front axle 102. Although not shown, a rear axle with a pair of rear wheels mounted at the two ends thereof is axially supported so as to rotate freely at a rear area of the vehicle body. While the HEV in the embodiment adopts the front-wheel-drive system with the front wheels 101 driven as main wheels with motive power and the rear wheels (not shown) free-wheeling, it may instead adopt a rear wheel drive system, in which the rear wheels are driven as main wheels.

A front wheel-side differential gear (hereafter referred to as a "front wheel-side DEF") 103 is mounted at a central position of the front axle 102. The front axle 102 is mechanically connected to the output side of the front wheel-side DEF 103. And output shaft of a transmission 105 is mechanically connected to the input side of the front wheel-side DEF 103. The front wheel-side DEF 103 is a differential power transfer mechanism that distributes the rotational drive force having undergone speed change at the transmission 105 and transmitted from the transmission 105 to the left and right ends of the front axle 102. The output side of the motor generator 130 is mechanically connected to the input side of the transmission 105. The output side of the engine 104 and the output side of the motor generator 140 are mechanically connected via a power transfer mechanism 150 to the input side of the motor generator 130.

It is to be noted that the motor generators 130 and 140 and the power transfer mechanism 150 are all housed inside a casing of the transmission 105.

The power transfer mechanism 150 is a differential mechanism constituted with gears 151 through 158. The gears 153 through 156 among these gears are bevel gears. The gears 151, 152, 157 and 158 are spur gears. The power generated at the motor generator 130 is directly transmitted to the transmission 150. The motor generator 130 is mounted coaxially with the gear 157. Thus, if no drive power is supplied to the motor generator 130, the power transmitted to the gear 157 is directly transmitted to the input side of the transmission 105. As the engine 104 starts up and the gear 151 is driven, the power from the engine 104 is transmitted from the gear 151 to the gear 152, then from the gear 152 to the gears 154 and 156, from the gears 154 and 156 to the gear 158 and finally to the gear 157. As the motor generator 140 is engaged in operation and the gear 153 is driven, the rotation of the motor generator 140 is transmitted from the gear 153 to the gears 154 and 156, then from the gears 154 and 156 to the gear 158 and finally to the gear 157.

It is to be noted that the power transfer mechanism 150 may be another type of mechanism such as a planetary gear mechanism.

The motor generator 130 is a synchronous machine that includes a rotor equipped with a permanent magnet for magnetic field generation. It is driven as an inverter device 110 controls AC power supplied to an armature coil at a stator. The motor generator 140 is also a synchronous machine similar to the motor generator 130 and its drive is controlled by an inverter device 120. A battery 106 is electrically connected to the inverter devices 110 and 120 and thus, electrical power can be supplied from the battery 106 to the inverter devices 110 and 120 and power can also be supplied from the inverter devices 110 and 120 to the battery 106.

The HEV in the embodiment includes two power generation units, i.e., a first motor generator unit constituted with the motor generator 130 and the inverter device 110 and a second motor generator unit constituted with the motor generator 140 and the inverter device 120, which are selectively engaged in operation in correspondence to the driving state. Namely, the drive torque of the vehicle being driven with the motive power originating from the engine 104 can be assisted by starting up the second motor generator unit with the motive power from the engine 104 to engage it in operation as a power generation unit to generate electric power and by engaging the first motor generator unit in operation as a motor unit with the electric power generated via the second motor generator unit. In addition, the vehicle speed of the vehicle being driven with power from the engine can be assisted by starting up the first motor generator unit as a generator unit to generate power with the power from the engine 104 and by engaging the second motor generator unit in operation as a motor unit with the electric power generated via the first motor generator unit.

Furthermore, the first motor generator unit can be engaged in operation as a motor unit with electric power supplied from the battery 106 and thus, the vehicle can be driven with the motive power from the motor generator 130 alone in the embodiment.

Moreover, the battery 106 can be charged with electric power generated by engaging the first motor generator unit or the second motor generator unit in operation as a power generation unit with motive power from the engine 104 or power originating from the wheels in the embodiment.

Figure 7:
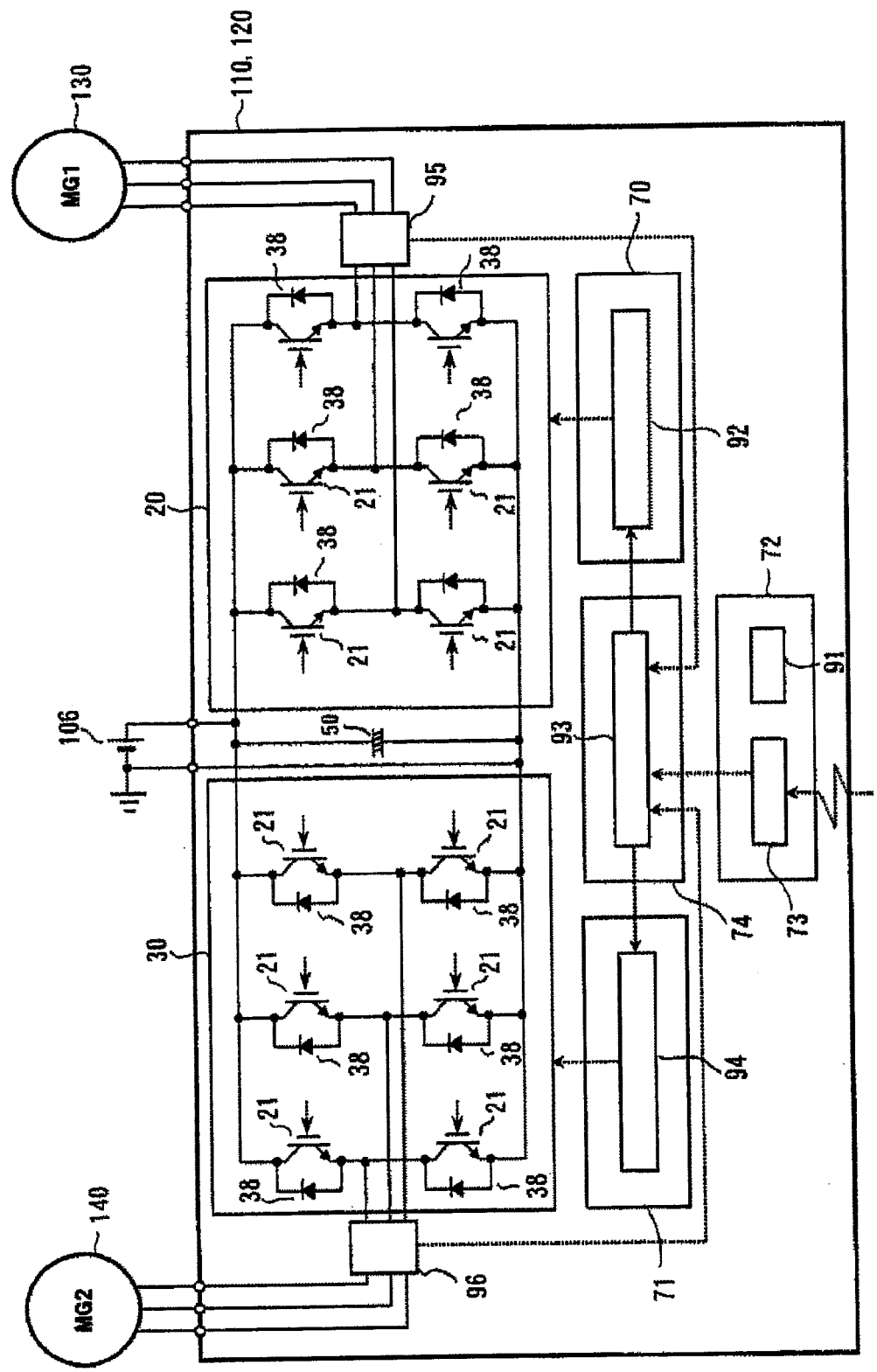

Next, the electrical circuit structure adopted in conjunction with the inverter devices 110 and 120 in the embodiment is explained in reference to FIG. 7.

The inverter devices 110 and 120 in the embodiment are provided as a single integrated inverter device unit. The inverter device unit includes a semiconductor module 20 of the inverter device 110, a semiconductor module 30 of the inverter device 120, a capacitor 50, a drive circuit 92 mounted at a drive circuit board 70 of the inverter device 110, a drive circuit 94 mounted at a drive circuit board 71 of the inverter device 120, a control circuit mounted at a control circuit board 74, a connector 73 and a drive circuit 91 that drives a discharge circuit (not shown) of the capacitor 50, both mounted at a connector board 72, and current sensors 95 and 96.

It is to be noted that in the illustration of the embodiment, the power system is indicated by solid lines and the signal system is indicated by dotted lines so as to indicate them as distinct from each other.

The semiconductor modules 20 and 30 respectively constitute power conversion main circuits in the corresponding inverter devices 110 and 120 and each includes a plurality of switching power semiconductor elements. The semiconductor modules 20 and 30 engage in operation in response to drive signals output from the corresponding drive circuits 92 and 94, convert DC power supplied from a high-voltage battery HBA to three-phase AC power and supply the power resulting from the conversion to armature coils of the corresponding motor generators 130 and 140. The main circuits are each structured as a three-phase bridge circuit with serial circuits, each corresponding to one of the three phases, connected electrically parallel to one another between the positive pole-side and the negative pole-side of the battery 106.

The serial circuits, which are also referred to as arms, are each formed by electrically serially connecting an upper arm-side switching power semiconductor element and a lower arm-side switching power semiconductor element. The switching power semiconductor elements used in the embodiment are IGBTs (insulated gate-type bipolar transistors) 21. An IGBT 21 includes three electrodes, i.e., a collector electrode, an emitter electrode and a gate electrode. Between the collector electrode and the emitter electrode, a diode 38 is electrically connected at the IGBT 21. The diode 38 includes two electrodes, i.e., a cathode electrode and an anode electrode and the cathode electrode is electrically connected to the collector electrode of the IGBT 21 and the anode electrode is electrically connected to the emitter electrode of the IGBT 21 so as to set the direction running from the emitter electrode toward the collector electrode at the IGBT 21 along the forward direction.

Alternatively, the switching power semiconductor elements may be MOSFETs (metal oxide semiconductor field effect transistors). A MOSFET includes three electrodes, i.e., a drain electrode, a source electrode and a gate electrode. It is to be noted that since a MOSFET includes an incidental diode present between the source electrode and the drain electrode and assuming a forward direction running from the drain electrode toward the source electrode, there is no need to install a special diode and in this sense, it is different from an IGBT.

The arms corresponding to the individual phases are each formed by electrically serially connecting the source electrode of an IGBT 21 with the drain electrode of another IGBT 21. It is to be noted that while the illustration of the embodiment shows a single IGBT constituting an upper or lower arm in correspondence to each phase, a plurality of IGBTs connected electrically in parallel to one another may constitute an upper or lower arm. As detailed later, an upper or lower arm corresponding to each phase is constituted with three IGBTs in the embodiment.

The drain electrode of the IGBT 21 constituting the upper arm in each phase is electrically connected to the battery 106 on the positive pole-side, whereas the source electrode of the IGBT 21 constituting the lower arm in correspondence to each phase is electrically connected to the battery 106 on the negative pole-side. The neutral point between the two arms in each phase (the connection area where the source electrode at the upper arm IGBT and the drain electrode at the lower arm IGBT are connected with each other) is electrically connected to the armature coil in the corresponding phase at the corresponding motor generator 130 or 140.

The drive circuits 92 and 94 respectively constitute the drive units for the corresponding inverter devices 110 and 120 and generate drive signals to be used to drive the IGBTs 21 based upon a control signal (control value) output from the control circuit 93. The drive signals generated in the respective circuits are output to the corresponding semiconductor modules 20 and 30. The drive circuits 92 and 94 are each constituted with a 6-in-1 type integrated circuit formed by integrating a plurality of circuits corresponding to the upper and lower arms in the individual phases into a single circuit. The circuits corresponding to the upper and lower arms in each phase include, for instance, an interface circuit, a gate circuit and an error detection circuit.

The control circuit 93, which functions as a control unit for the inverter devices 110 and 120, is constituted with a microcomputer that generates through arithmetic operation a control signal (control value) based upon which the plurality of switching power semiconductor elements are engaged in operation (turned on/off). Sensor signals (sensor values) provided from the current sensors 95 and 96 and rotation sensors mounted at the motor generators 130 and 140, as well as a torque command signal (a torque command value) provided from a higher-order control device, are input to the control circuit 93. Based upon the signals input thereto as described above, the control circuit 93 generates a control signal (control value) through arithmetic operation and outputs the control signal thus generated to the drive circuits 92 and 94.

The connector 73 electrically connects the internal components in the inverter devices 110 and 120 with an external control device.

The capacitor 50, which functions as a smoothing circuit for minimizing the extent of DC voltage fluctuation bound to occur as the IGBTs 21 are engaged in operation, is connected electrically parallel to the DC-side of the semiconductor modules 20 and 30.

The drive circuit 91 drives a discharge circuit (not shown) via which the electrical charge collected at the capacitor 50 is discharged.

Next, the actual structure adopted in the inverter devices 110 and 120 is described in reference to FIGS. 1 through 6.

The inverter device unit in the embodiment includes a casing (inverter case) formed by stacking a second base 12 atop a lower case 13, a first base 11 atop the second base and an upper case 10 atop the first base 11. The casing is a rectangular parallelepiped container taking on rounded contours as a whole. The components constituting the casing are all constituted with a thermally conductive aluminum material.

The internal space inside the casing is separated into two spaces along the vertical direction via the plate-like first base 11 and the pi ($\pi$)-shaped second base 12 and two cooling chambers with all their peripheral boundaries (peripheral walls, ceilings and floors) defined by thermally conductive members are formed in the casing. Two coolant passages 28, through which coolant (cooling water) is to flow, are formed at the first base 11 and the second base 12 forming a partition wall separating the two cooling chambers. The two cooling chambers in the casing structured as described above are thermally isolated from each other. Namely, the extent to which one coolant is thermally affected by the other cooling chamber is minimized.

In the upper cooling chamber within the casing, the semiconductor modules 20 and 30 assuming a shape and size with a significant measurement taken along the longer side of the casing and a less significant measurement taken along the shorter side of the casing, are housed side-by-side along the direction in which the shorter side of the casing extends, above the coolant passages 28. This thermally connects the semiconductor modules 20 and 30 with the coolant passages 28, allowing the heat generated as the IGBTs 21 are engaged in operation to be absorbed via the coolant. As a result, the extent to which the heat released from the semiconductor modules 20 and 30 affects the cooling chamber present below can be reduced.

At a side end surface of the casing on one side along the longer side thereof, an intake piping 15 communicating with one of the coolant passages 28 and an outlet piping 16 communicating with the other coolant passage 28 are disposed. The coolant passages 28 extend parallel to one another from one side of the casing toward the other side along the longer side thereof and are in communication with each other at the end of the casing on the other side along the longer side of the casing. Namely, the coolant passages 28 together form a U-shape.

Heat transfer plates 23 are each disposed over the area where a coolant passage 28 is formed at the first base 11. The heat transfer plate 23 is a rectangular plate ranging from one side of the casing along the longer side thereof toward the other side along the coolant passage 28 and constitutes a surface of the coolant passage 28. The heat transfer plate 23 is thus directly cooled by the coolant flowing through the coolant passage 28. The heat transfer plate 23 is constituted of a thermally conductive material such as aluminum or copper, with cooling fins (not shown) projecting out into the coolant passage 28 formed at its surface toward the coolant passage 28. As a result, it is cooled by the coolant over a large cooling area so as to improve the cooling effect of the coolant.

Module cases 24 are disposed so as to range upright along the outer edges of the heat transfer plates 23 at the upper surfaces of the individual heat transfer plates 23. The module cases 24 each form three housing chambers in the space above the upper surface of the corresponding heat transfer plate 23 split via the module case into three areas along the longer side of the casing so as to house the IGBTs 21 and the diodes 38 in correspondence to the individual phases.

At the sidewall ranging along the longer side of each module case 24, facing opposite the semiconductor module 20 or 30, a DC positive pole-side module terminals 26 and a DC negative pole-side module terminals 33 are disposed in correspondence to each housing chamber. The DC positive pole-side module terminals 26 and the DC negative pole-side module terminals 33 project out upward beyond the side wall of each module case 24. The sides of the DC positive pole-side module terminals 26 and the DC negative pole-side module terminals 33 opposite from the projecting sides extend to the inner space in the housing chamber with their surfaces exposed at the surface of the module case 24. As a result, a DC positive pole-side module electrode 36 and a DC negative pole-side module electrode 37 are formed within each housing chamber.

At the side wall ranging along the longer side of each module case 24, located on the side opposite from the side facing the semiconductor module 20 or 30, an AC module terminals 27 is disposed in correspondence to each housing chamber. The AC module terminals 27 projects out upward beyond the side wall of the module case 24. The side of the AC module terminals 27 opposite from the projected side extends to the inner space of the housing chamber and its surface is exposed over the surface of the module case 24. As a result, an AC module electrode 35 is formed inside each housing chamber.

Two insulating substrates 22 are disposed side-by-side in correspondence to each housing chamber along the longer side of the casing at the upper surface of the heat transfer plate 23. Two plate-like wiring members 39 are disposed side-by-side along the longer side of the casing at the upper surface of each insulating substrate 22. One of the wiring members 39 disposed at one of the two insulating substrates 22 in each housing chamber is electrically connected with the DC positive pole-side module electrode 36. One of the wiring members 39 disposed at the other insulating substrate 22 in each housing chamber is electrically connected with the DC negative pole-side module electrode 37. The other wiring members 39 at the two insulating substrates 22 in each housing chamber are electrically connected with the AC module electrode 35. They are electrically connected with the respective electrodes via electrically conductive wire 29.

At the upper surface of one of the wiring members 39 at each of the two insulating substrates 22 in each housing chamber, three IGBT/diode set each constituted with an IGBT 21 and a diode 38 disposed side-by-side along the longer side of the casing, are set side-by-side along the shorter side of casing. The upper and lower arms are thus formed in correspondence to the individual phases. The IGBTs 21 and the diodes 38 are electrically connected with the wiring members 39 which is electrically connected with the AC module electrode 35. The gate electrodes of the IGBTs 21 are electrically connected to connectors 25. These electrical connections are achieved via electrically conductive wire 29. The connectors 25 are each disposed at one of the four sidewalls defining three separate areas above the upper surface of each heat transfer plate 23 at the module case 24.

A plate-like module case lid 34 is disposed at the top of each module case 24. The module case lid 34 forms a ceiling that covers the open top of the module case 24 so as to seal off the housing chambers and is constituted of the same material as that constituting the module case 24, i.e., an insulating resin. At the upper surface of the module case lid 34, a wiring sheet 31 and a wiring connector 32 electrically connected to the wiring sheet 31 are disposed. The wiring sheet 31 is electrically connected with the connectors 25 projecting upward via through holes formed at the module case lid 34. The wiring connector 32 is electrically connected with the drive circuits 92 and 94 at the drive circuit boards 70 and 71 via wirings (not shown).

The capacitor 50, the drive circuit board 70 and 71, the control board 74 and the connector board 72 are housed inside the cooling chamber located toward the bottom of the casing.

The capacitor 50 is disposed toward the bottom side at the center (the area enclosed by the two legs of the n) of the second base 12, at a position in close proximity to the DC-side of the semiconductor modules 20 and 30. The capacitor 50 is constituted with four electrolytic capacitors with their sections taken along the height of the casing assuming an elliptical shape. The four electrolytic capacitors are disposed so that their longer sides are aligned with the longer side of the casing with two electrolytic capacitors set side-by-side both along the longer side and along the shorter side of the casing. They are housed inside a capacitor case 51 via a holding band 52. The capacitor case 51 is a thermally conductive container with an open top, with a flange portion at the top of the case set in contact with the lower ends of the two legs of the π shape assumed at the second base 12. Thus, the capacitor 50 is thermally connected with the coolant passages and the capacitor 50 can be cooled with the coolant.

The electrolytic capacitors each include a positive pole-side capacitor terminal 57 and a negative pole-side capacitor terminal 56 passing through a capacitor lid 54 closing off the open top of a capacitor case 53. The positive pole-side capacitor terminal 57 and the negative pole-side capacitor terminal 56, both assuming the shape of a plate, face opposite each other along the shorter side and a plate-like insulating member 55 formed as an integrated part of the capacitor lid 54 is held between the capacitor terminals 57 and 56 from the shorter side. The capacitor terminals are set so that capacitor terminals adjacent to each other along the shorter side will assume positions not in line with each other along the longer side when the four electrolytic capacitors are housed inside the capacitor case 53.

The drive circuit board 70 is disposed toward the bottom of the second base 12 on the side where the semiconductor module 20 is present, over an area enclosed by one of the two legs of the π shape and the flange portion of the second base 12. The drive circuit board 71 is disposed toward the bottom of the second base 12 on the side where the semiconductor module 30 is present, over an area enclosed by the other leg of the π shape and flange portion of the second base 12. The drive circuit boards 70 and 71 are thermally connected with the second base 12. Thus, the drive circuit boards 70 and 71 are thermally connected with the coolant passages 28 and the drive circuit boards 70 and 71 can be cooled with the coolant in the coolant passages.

The control circuit board 74 is disposed so as to face opposite the side surface of the capacitor case 53 on one side (toward the semiconductor module 30) along the shorter side of the capacitor case. The control circuit board 74 is thermally connected with the second base 12. Since this allows the control circuit board 74 to be thermally connected with a coolant passage 28, the control circuit board 74 can be cooled with the coolant.

The connector board 72 is disposed so as to face opposite the side surface of the capacitor case 53 on the other side (toward the semiconductor module 20) along the shorter side of the capacitor case. The connector board 72 is thermally connected with the second base 12. Since this allows the connector board 72 to be thermally connected with a coolant passage 28, the connector board 72 can be cooled with the coolant. A connector 73 on the other side projects to the outside through a side end surface of the casing along the lengthwise direction.

The capacitor 50 is electrically connected with the semiconductor modules 20 and 30 via a DC-side connecting conductor 40. The DC-side connecting conductor 40 extends to the upper cooling chamber and the lower cooling chamber via a through hole passing through the first base 11 and the second base along the height of the casing, which is formed as an elongated hole (elongated along the longer side of the casing) to pass through the central areas of the first base and the second base.

The DC-side connecting conductor 40 is a wiring member adopting a laminated structure that includes a plate-like DC positive pole-side bus bar 45 extending along the longer side of the casing and a plate-like DC negative pole-side bus bar 44 ranging along the longer side of the casing, laminated one on top of the other via an insulating sheet 43 along the shorter side of the casing, with DC positive pole-side module terminals 42 and a positive pole-side capacitor terminal 46 formed as integrated part of the DC positive pole-side bus bar 45 and DC negative pole-side module terminals 41 and negative pole-side capacitor terminals 47 formed as integrated part of the DC negative pole-side bus bar 44. By adopting this structure, the inductance between the capacitor 50 and the semiconductor modules 20 and 30 can be lowered, which, in turn, inhibits heat generation due to the loss occurring as the IGBTs 21 are switched.

The DC positive pole-side module terminals 42 are electrically connected with the DC positive pole-side module terminals 33, as the DC positive pole-side module terminals 42 extends upward from the top of the DC positive pole-side bus bar 45 at the position at which the DC positive pole-side module terminals 33 project upward from the module case 24 and the DC positive pole-side module terminals 42 facing opposite the DC positive pole-side module terminals 33 along the shorter side of the casing are fixed onto the DC positive pole-side module terminals 33 via fixing means such as screws. The DC negative pole-side module terminals 41 are electrically connected with the DC negative pole-side module terminals 26, as the DC negative pole-side module terminals 41 extend upward from the top of the DC negative pole-side bus bar 44 at the positions at which the DC negative pole-side module terminals 26 project upward from the module case 24 and the DC negative pole-side module terminals 41 facing opposite the DC negative pole-side module terminals 26 along the shorter side of the casing are fixed onto the DC negative pole-side module terminals 26 via fixing means such as screws.

The positive pole-side capacitor terminals 46 and the negative pole-side capacitor terminals 47 extend downward through the bottoms of the DC positive pole-side bus bar 45 and the DC negative pole-side bus bar 44 at the positions at which the capacitor terminals project out so as to clamp the capacitor terminals from the shorter side of the casing along the shorter side of the casing and are fixed to the capacitor terminals with the matching polarities facing opposite them via fixing means such as screws, thereby becoming electrically connected to the capacitor terminals with the matching polarities. By adopting this wiring structure, the positive pole side and the negative pole side can be set facing opposite each other over the wiring area extending from the DC positive pole-side bus bar 45 and the DC negative pole-side bus bar 44 to the individual capacitor terminals. With such a wiring member, the inductance is further reduced so as to further inhibit heat generation due to the loss occurring as the IGBTs 21 are switched.

A DC terminal 80 is disposed at an end of the casing on the other side along the longer side of the casing. The DC terminal 80 includes a DC positive pole-side external terminal 82, a DC negative pole-side external terminal 81, a DC positive pole-side connector terminal 86, a DC negative pole-side connector terminal 85, a DC positive pole-side bus bar 84 which connects the DC positive pole-side external terminal 82 and the DC positive pole-side connector terminal 86 and a DC negative pole-side bus bar 83 which connects the DC negative pole-side external terminal 81 with the DC negative pole-side connector terminal 85.

The DC positive pole-side external terminal 82 and the DC negative pole-side external terminal 81 are electrically connected with an external cable extending via a connector mounted at a through hole 17 formed at a side end surface of the casing on the other side along the lengthwise direction. The DC positive pole-side bus bar 84 and the DC negative pole-side bus bar 83 extend toward the semiconductor modules 20 and 30 so as to face opposite each other along the shorter side of the casing. The DC positive pole-side connector terminal 86 is electrically connected to the DC positive pole-side module terminals 33 and 42, whereas the DC negative pole-side connector terminal 85 is electrically connected to the DC negative pole-side module terminals 26 and 41.

A hole 18 formed at the upper surface of the upper case 10 is used when connecting the DC positive pole-side external terminal 82 and the DC negative pole-side external terminal 81 to an external cable and is blocked off with a lid at all times except while connecting the terminals to the external cable.

Inside the casing, an AC bus bar 60 for the three phases is disposed at each of the two ends along the shorter side of the casing. The AC bus bar 60 extends from the lower cooling chamber to the upper cooling chamber via a vertical (along the height of the casing) through hole formed through the first base 11 and the second base 12 at an end of the casing along the shorter side thereof. AC-side module terminals 61 are formed at one end of the AC bus bar 60 at the upper cooling chamber. The AC-side module terminals 61 face opposite the AC-side module terminals 27 along the shorter side of the casing and are electrically connected to the AC-side module terminals 27 via fixing means such as screws fixing the AC-side module terminals 61 to the AC-side module terminals 27. External connector terminals 62 via which connection with the external cables extending to the motor generators 130 and 140 is achieved are formed at the other end of the AC bus bar 60 in the lower cooling chamber and the external connector terminals 62 are held by terminal holders 63.

It is to be noted that reference numeral 14 indicates a mounting leg via which the inverter device unit casing is fixed onto the casing of the transmission 105 or to the casing of the engine 104 and the transmission 105. The mounting legs are formed by using a rigid material such as SUS to assure sufficient strength. In addition, they assume a bent shape so as to achieve elasticity in order to damp vibration from the transmission 15 and the engine 104.

In the embodiment described above, a cooling chamber, the entire periphery of which is defined by a thermally conductive member, is formed inside the inverter device unit casing and the semiconductor modules 20 and 30 are housed inside this chamber. Thus, even if a greater quantity of heat is generated at the compact IGBTs 21 and more heat is released from the semiconductor modules 20 and 30, the heat is not let out of the cooling chamber. As a result, the extent to which the other components of the inverter device, such as the capacitor 50, are thermally affected can be minimized.

Second Embodiment

Figure 9:
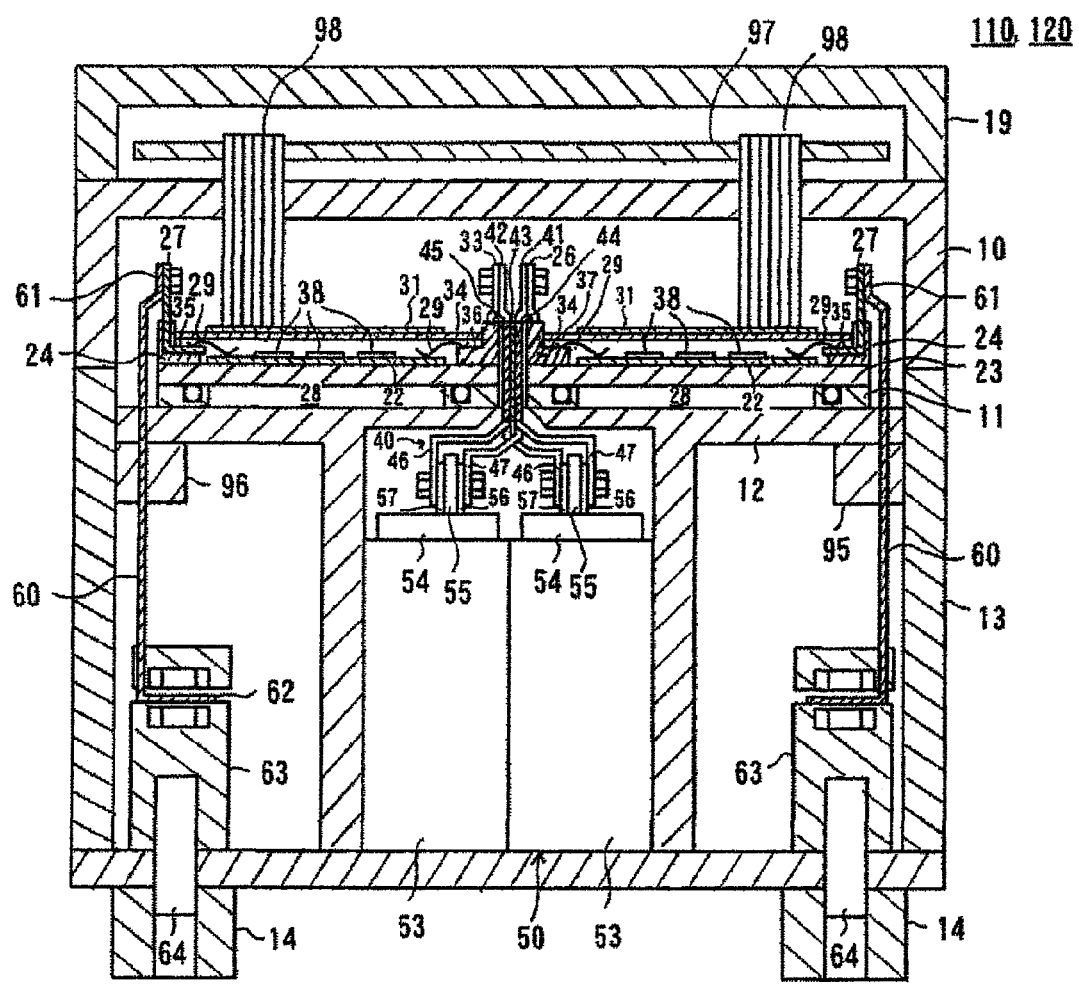

The second embodiment of the present invention is now described in reference to FIG. 9.

Since the second embodiment is achieved by modifying the first embodiment, the same reference numerals are assigned to identical components and their explanation is omitted.

This embodiment differs from the first embodiment in that a third cooling chamber, enclosed in its entirety by the upper case 10 and a second upper case 19, is formed above the cooling chamber in which the semiconductor modules 20 and 30 are housed and that a board 97 formed by integrating the drive circuit board, the control circuit board and the connector board into a single board is housed inside the third cooling chamber.

The wiring sheets at the semiconductor modules 20 and 30 are electrically connected to the board 97 via wiring members 98.

The structure achieved in the second embodiment does not include a capacitor case for the capacitor 50 and the legs of the n-shaped second base 12 are used in place of the capacitor case. For this reason, the legs of the n-shaped second base 12 extend to the bottom of the lower case 13.

In addition, the mounting legs 14 assume a hollow structure and power cables 64 electrically connected to the AC external terminals 62 are threaded through the hollow mounting legs to be led into the casing of the transmission 105. By adopting this structure, the power cables 64 led into the casing of the transmission 105 with ease can then be connected to the motor generators 130 and 140.

The embodiment achieves an advantage similar to that of the preceding embodiment in that even when a greater quantity of heat is generated at the compact IGBTs 21 and more heat is released from the semiconductor modules 20 and 30, the heat is not readily let out of the cooling chamber, so as to minimize the extent to which other components of the inverter device, such as the capacitor 50, are thermally affected.

Third Embodiment

Figure 10:
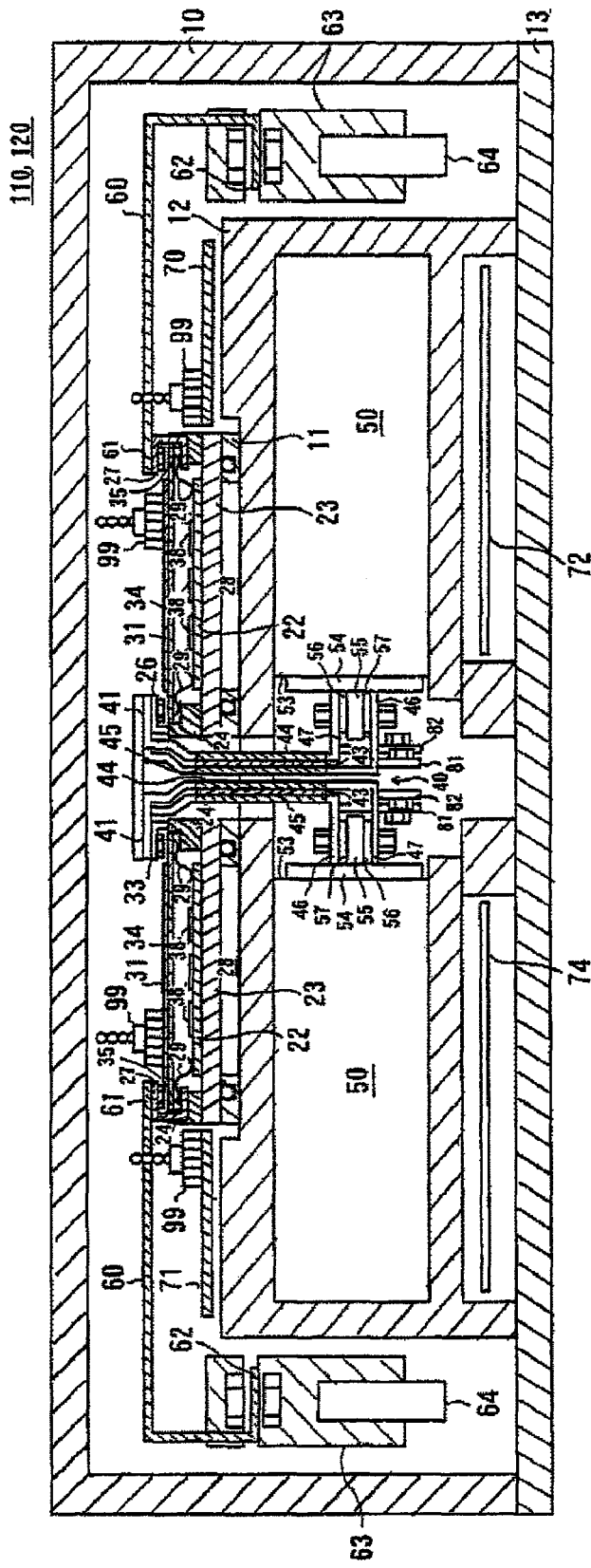

The third embodiment of the present invention is now described in reference to FIG. 10.

Since the third embodiment is achieved by modifying the first embodiment, the same reference numerals are assigned to identical components and their explanation is omitted.

The third embodiment differs from the first embodiment in that the drive circuit boards 70 and 71, the AC bus bar 60 and the terminal holders 63 are housed together with the semiconductor modules 20 and 30 in the cooling chamber.

In addition, a second cooling chamber, defined by the second base 12, is formed under the cooling chamber housing the semiconductor modules 20 and 30 and two third cooling chambers, defined by the second base 12, are formed under the second cooling chamber. The capacitor 50 is housed in the second cooling chamber, the control circuit board 74 is housed in one of the third cooling chambers and the connector board 72 is housed inside the other third cooling chamber. The capacitor 50 is installed with a lateral orientation in two split parts separated from each other along the shorter side of the casing. Accordingly, the DC-side connecting conductor 40, too, is divided into a part located on the side toward the semiconductor module 20 and a part located on the side toward the semiconductor module 30. It is to be noted that while the DC-side connecting conductor 40 assumes a structure similar to that in the first embodiment, the bends at the individual terminals are partially modified. In addition, DC positive pole-side external terminals 82 and DC negative pole-side external terminals 81 are formed at the DC-side connecting conductor 40 as integrated parts thereof.

It is to be noted that reference numeral 99 indicates connector wiring that electrically connects the drive circuit board 70 or 71 with a wiring sheet 31.

The embodiment achieves an advantage similar to that of the preceding embodiments in that even when a greater quantity of heat is generated at the compact IGBTs 21 and more heat is released from the semiconductor modules 20 and 30, the heat is not readily let out of the cooling chamber, so as to minimize the extent to which other components of the inverter device, such as the capacitor 50, are thermally affected.

Fourth Embodiment

Figure 11:
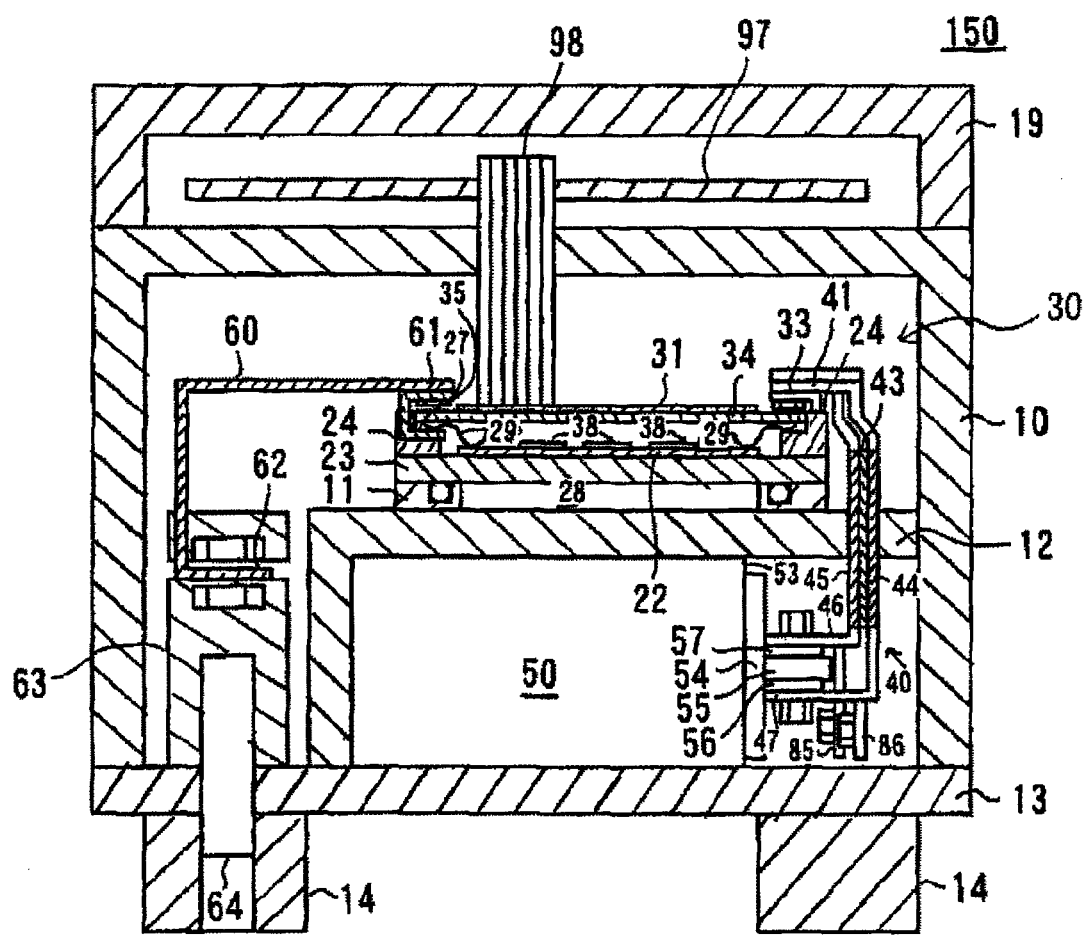
Figure 12:
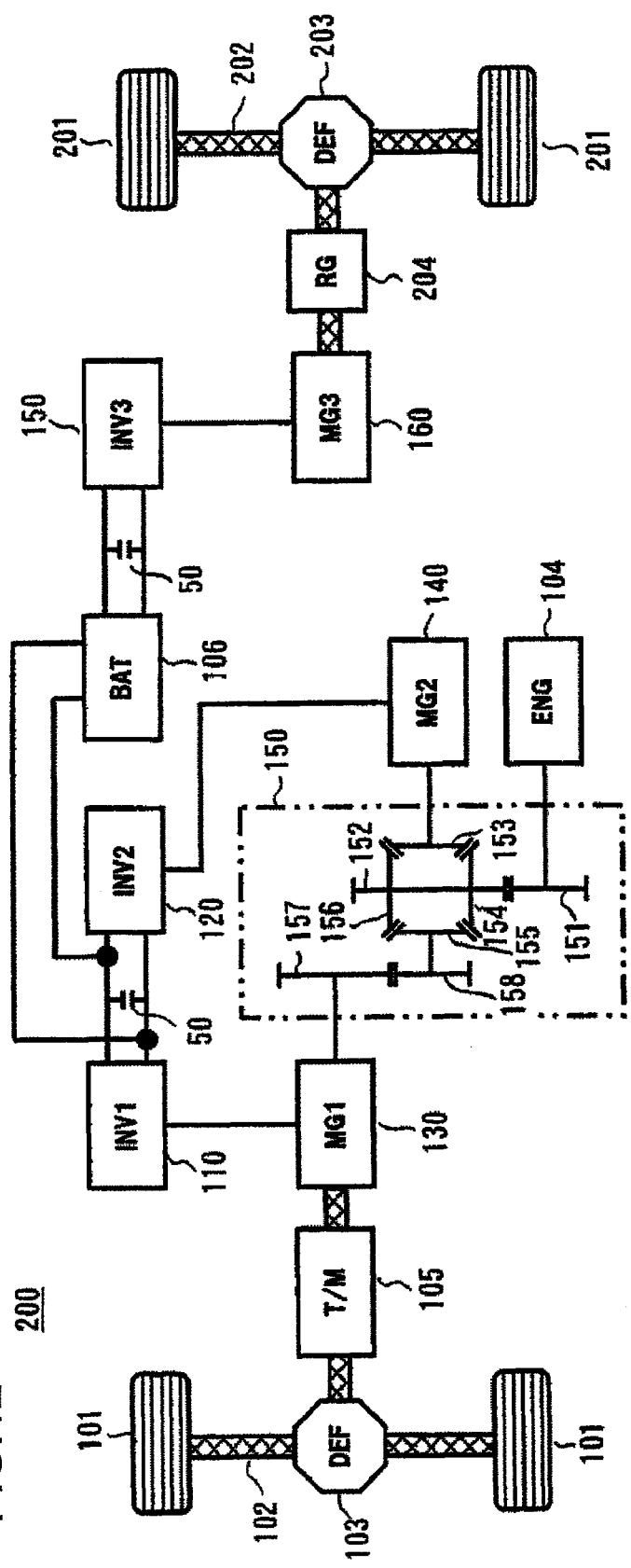

The fourth embodiment of the present invention is now described in reference to FIGS. 11 and 12.

Since the fourth embodiment is achieved by modifying the first embodiment, the same reference numerals are assigned to identical components and their explanation is omitted.

The fourth embodiment differs from the third embodiment in that a motor generator 160 is utilized to drive the rear wheels 201. Accordingly, the structure achieved in the embodiment includes a single inverter device unit 150. The speed of the motive power originating from the motor generator 160 is reduced at a speed-reducer 204, is transmitted to a rear-side differential gear 203 and is then transmitted from the rear-side differential gear 203 to the rear axle 202. Namely, the fourth embodiment provides a four-wheel-drive hybrid vehicle. The inverter device 150 is connected to the battery 106. When the motor generator 160 is utilized as an electric motor, electric power is supplied from the battery 106 to the inverter device 150, whereas when it is utilized as a generator, electric power is supplied from the inverter device 150 to the battery 106.

The inverter device 150 adopts a structure equivalent to the left half of the inverter device unit in the third embodiment ranging to the left beyond the center of the casing along the shorter side thereof, with a third cooling chamber formed above the cooling chamber housing the semiconductor module 30, as in the inverter device unit achieved in the second embodiment. A board 97, achieved by integrating the drive circuit boards, the control circuit board and the connector board into a single board, is housed inside the third cooling chamber.

In addition, the power cables 64 are led into the casing of the transmission 105 through the hollow mounting legs 14 as in the inverter device unit in the second embodiment.

The inverter device 150 may adopt a structure that is an exact equivalent to the left half or the right half of the inverter device unit achieved in any of the first through third embodiments ranging to the left or the right from the center of the casing along the shorter side thereof.

The embodiment achieves an advantage similar to that of the preceding embodiments in that even when a greater quantity of heat is generated at the compact IGBTs 21 and more heat is released from the semiconductor modules 20 and 30, the heat is not readily let out of the cooling chamber, so as to minimize the extent to which other components of the inverter device, such as the capacitor 50, are thermally affected.

The invention claimed is:

1. A power converter, comprising:
   a semiconductor module constituting a main circuit for power conversion;
   a capacitor electrically connected to the main circuit;
   a drive circuit that provides the main circuit with a drive signal used in power conversion operation;
   a control circuit that provides the drive circuit with a control signal used to prompt the drive circuit to provide the drive signal; and
   a cooling chamber comprising a coolant passage formed therein, all housed inside a casing, wherein:
   a chamber wall of the cooling chamber is formed with a thermally conductive material;
   at least the semiconductor module is housed inside the cooling chamber; and
   at least the capacitor and be control circuit are disposed outside the cooling chamber,
   further wherein the coolant passage is located over a lower area of the cooling chamber; and
   the capacitor, thermally isolated from the semiconductor module via the coolant passage, is disposed on a lower side relative to the cooling chamber and is also thermally connected to the coolant passage.

2. A power converter according to claim 1, wherein:
   the cooling chamber is located at an uppermost position inside the casing.

3. A power converter according to claim 1, wherein:
   the control circuit, thermally connected to the coolant passage, is disposed on an upper side relative to the cooling chamber.

4. A power converter according to claim 1, wherein:
   the control circuit, thermally connected to the coolant passage, is disposed on a lower side relative to the cooling chamber.

5. A power converter according to claim 4, wherein:
   the control circuit is disposed on a lower side relative to the capacitor.

6. A power converter according to claim 3, wherein:
   the drive circuit, thermally connected to the coolant passage, is disposed together with the control circuit on the upper side relative to the cooling chamber.

7. A power converter according to claim 4, wherein:
   the drive circuit, thermally connected to the coolant passage, is disposed together with the control circuit on the lower side relative to the cooling chamber.

8. A power converter according to claim 1, wherein:
   the drive circuit, thermally connected to the coolant passage, is housed inside the cooling chamber.

9. A power converter according to claim 1, wherein:
   the power convertor is adopted in a hybrid vehicle comprising an internal combustion engine and an electric motor used as vehicle drive sources with motive power output from the internal combustion engine and motive power output from the electric motor transmitted to an axle via a transmission and the electric motor installed inside a casing of the transmission, and
   the power converter is installed above the casing of the transmission or above both the casing of the transmission and a casing of the internal combustion engine, via a rigid member constituted of a material with lower thermal conductivity relative to the thermally conductive material.

10. A power converter according to claim 9, further comprising:
a wiring member that electrically connects the semiconductor module with the electric motor, wherein:
the rigid member is hollow inside; and
the wiring member passes through the hollow rigid member, reaches inside the casing of the transmission and is connected to the electric motor.

11. A power converter comprising:
a semiconductor module that comprises a semiconductor element for switching used to convert input electric power to specific electric power and output the specific electric power resulting from conversion;
a smoothing capacitor electrically connected to the semiconductor element;
a drive circuit that, based upon a control signal, provides the semiconductor element with a drive signal used to drive the semiconductor element; and
a control circuit that provides the control signal to the drive circuit, all housed inside a casing, wherein:
a separate chamber is formed inside the casing;
the separate chamber is an adiabatic chamber comprising a coolant passim formed therein and a partitioning wall defining the chamber and constituted of a thermally conductive material so as to inhibit heat release from inside the chamber to an outside;
at least the semiconductor module is housed inside the adiabatic chamber; and
at least the smoothing capacitor and the control circuit are disposed outside the adiabatic chamber,
further wherein the coolant passage is located over a lower area of the adiabatic chamber; and
the capacitor, thermally isolated from the semiconductor module via the coolant passage, is disposed on a lower side relative to the adiabatic chamber and is also thermally connected to the coolant passage.

12. A power converter according to claim 11, wherein:
the adiabatic chamber is located at, an uppermost position inside the casing.

13. A power converter, comprising:
a semiconductor module that converts input electric power to specific electric power and outputs the specific power resulting from conversion by engaging a semiconductor element in switching operation;
a capacitor that forms a smoothing circuit on a DC-side of the semiconductor element;
a drive circuit that provides the semiconductor element with a drive signal used to engage the semiconductor element in operation;
a control circuit that provides the drive circuit with a control signal used to generate the drive signal, all housed inside a casing, wherein;
an internal space at the casing is divided into a plurality of separate internal spaces;
in one of the separate internal spaces at the casing, which is defined and enclosed by a thermally conductive material, a coolant passage is formed and at least the semiconductor module is housed;
at least the capacitor and the control circuit are housed inside an other internal space at the casing not occupied by the semiconductor module;
the other separate internal space is formed under the one of the separate internal spaces at the casing;
the coolant passage is formed between the one of the separate internal spaces at the casing and the other separate internal space at the casing; and
the capacitor, thermally isolated from the semiconductor module via the coolant passage, is housed in the other separate internal space at the casing and is thermally connected to the coolant passage.

14. A power converter, comprising:
a semiconductor module that converts input electric power to specific electric power and outputs the specific power resulting from conversion by engaging a semiconductor element in switching operation;
a capacitor that forms a smoothing circuit on a DC-side of the semiconductor element;
a drive circuit that provides the semiconductor element with a drive signal used to engage the semiconductor element in operation;
a control circuit that provides the drive circuit with a control signal used to generate the drive signal, all housed inside a casing, wherein:
an internal space at the casing is divided into a plurality of separate internal spaces;
in one of the separate, internal spaces at the casing, which is defined and enclosed by a thermally conductive material, a coolant passage is formed and at least the semiconductor module is housed;
at least the capacitor and the control circuit are housed inside an other internal space at the casing not occupied by the semiconductor module; and
the one of the separate internal spaces at the casing is present at an uppermost position inside the casing.

15. A power converter, comprising:
a semiconductor module constituting a main circuit for power conversion;
a capacitor electrically connected to the main circuit;
a drive circuit that provides the main circuit with a drive signal used in power conversion operation;
a control circuit that provides the drive circuit with a control signal used to prompt the drive circuit to provide the drive signal; and
a wiring member that electrically connects the capacitor with the semiconductor module, all housed inside a casing, wherein:
the semiconductor module and the capacitor are disposed in close proximity to each other;
the wiring member comprises a positive pole-side plate-like wiring conductor having a positive pole-side plate-like wiring terminal formed as an integrated part thereof and a negative pole-side plate-like wiring conductor having a negative pole-side plate-like wiring terminal formed as an integrated part thereof, layered one on top of another via an insulating member;
the capacitor comprises a capacitor terminal formed by layering a positive pole-side plate-like capacitor terminal and a negative pole-side plate-like capacitor terminal one on top of another via an insulating member;
the capacitor and the wiring member are connected with each other by clamping the capacitor terminal between the positive pole-side plate-like wiring terminal and the negative pole-side plate-like wiring terminal so that terminals with matching polarity face opposite each other and by locking together the capacitor terminal, the positive pole-side plate-like wiring terminal and the negative pole-side plate-like wiring terminal from a clamping direction;
a cooling chamber with a coolant passage formed therein is formed inside the casing;
a peripheral wall defining the cooling chamber is constituted of a thermally conductive material;

at least the semiconductor module is housed inside the cooling chamber;

the coolant passage is located over a lower area of the cooling chamber;

the capacitor, thermally isolated from the semiconductor module via the coolant passage, is disposed on a lower side relative to the cooling chamber and is also thermally connected to the coolant passage; and the cooling chamber is located at an uppermost position inside the casing.

* * * * *